(12) United States Patent
Faue (10) Patent No.: US 7,224,637 B2
(45) Date of Patent: May 29, 2007

(54) TRI-MODE CLOCK GENERATOR TO CONTROL MEMORY ARRAY ACCESS

(75) Inventor: Jon Allan Faue, Colorado Springs, CO (US)

(73) Assignee: ProMOS Technologies Inc., Hsinchu (TW)

( * ) Notice: Subject to any disclaimer, the term of this patent is extended or adjusted under 35 U.S.C. 154(b) by 117 days.

(21) Appl. No.: 10/948,554

(22) Filed: Sep. 23, 2004

(65) Prior Publication Data

US 2006/0062064 A1    Mar. 23, 2006

(51) Int. Cl.
*G11C 8/18* (2006.01)

(52) U.S. Cl. ...................... 365/233; 365/193
(58) Field of Classification Search .............. 365/193
See application file for complete search history.

(56) References Cited

U.S. PATENT DOCUMENTS

| | | | | |
|---|---|---|---|---|
| 4,918,663 | A * | 4/1990 | Remington et al. | 365/226 |
| 5,276,649 | A * | 1/1994 | Hoshita et al. | 365/206 |
| 5,327,394 | A * | 7/1994 | Green et al. | 365/233.5 |
| 5,740,121 | A * | 4/1998 | Suzuki et al. | 365/233 |
| 5,886,946 | A * | 3/1999 | Ooishi | 365/233 |
| 5,986,967 | A * | 11/1999 | Furumochi et al. | 365/233 |
| 6,128,213 | A * | 10/2000 | Kang | 365/145 |
| 6,151,270 | A * | 11/2000 | Jeong | 365/233 |
| 6,151,271 | A * | 11/2000 | Lee | 365/233 |
| 6,192,003 | B1 * | 2/2001 | Ohta et al. | 365/233 |
| 6,236,619 | B1 * | 5/2001 | Cho et al. | 365/233 |
| 6,385,104 | B2 * | 5/2002 | Koshikawa | 365/201 |
| 6,504,789 | B2 * | 1/2003 | Hirakawa | 365/233 |
| 6,603,817 | B1 * | 8/2003 | Hamamoto et al. | 375/257 |
| 6,738,296 | B2 * | 5/2004 | Sung et al. | 365/189.07 |
| 6,781,919 | B2 * | 8/2004 | Mizuhashi | 365/233 |
| 7,075,853 | B2 * | 7/2006 | Jeong et al. | 365/233 |
| 2005/0254317 | A1 * | 11/2005 | Chan et al. | 365/194 |

* cited by examiner

*Primary Examiner*—Tan T. Nguyen
(74) *Attorney, Agent, or Firm*—Peter J. Meza; William J. Kubida; Hogan & Hartson LLP (57) ABSTRACT

A clock generator is provided that is compatible with both DDR1 and DDR2 applications. The internal YCLK signal is turned on only when an active read or write occurs on the integrated circuit memory, even though the main chip clock is always running. A circuit block within the clock generator detects when a read or write is active and initiates a YCLK signal on the next falling edge of the internal clock. Two separate mechanisms are used for determining when to terminate the YCLK. One mechanism is a timer path and the other is a path determined by DDR1 and DDR2 control signals. The timer path is strictly time based and is the same for DDR1 and DDR2 parts or modes of operation. The other signal path is different for DDR1 and DDR2 operating modes. A DDR1 control signal turns off YCLK at the next rising edge of the internal clock, and a DDR2 control signal turns off YCLK at the next falling edge of the internal clock.

9 Claims, 7 Drawing Sheets

TRI-MODE CLOCK GENERATOR TO CONTROL MEMORY ARRAY ACCESS

BACKGROUND OF THE INVENTION

The present invention relates, in general, to the field of integrated circuit memories. More particularly, the present invention relates to a clock generator circuit that is particularly suited to those memories in which both DDR-1 and DDR-2 modes of operation are required.

Figure 1:
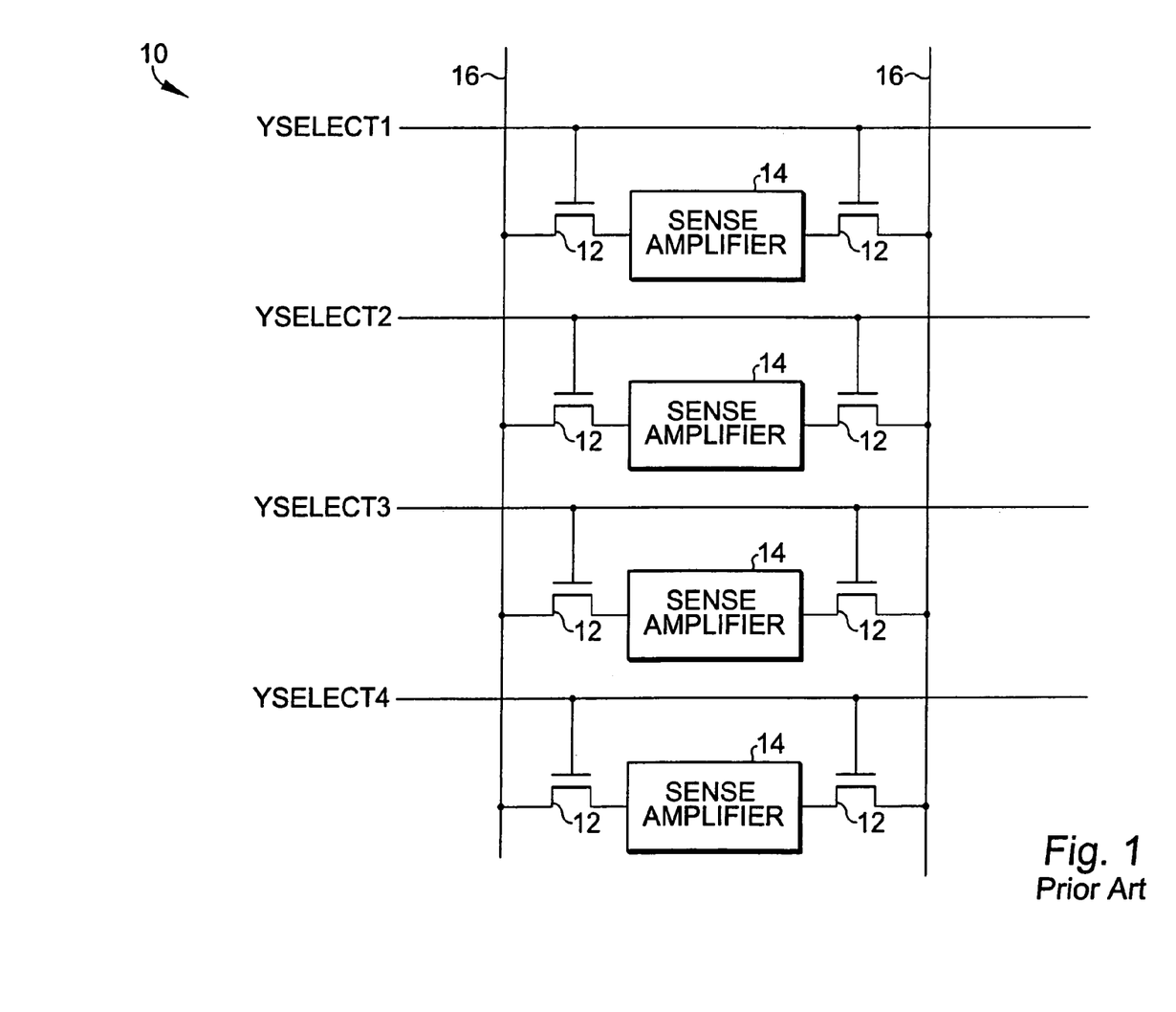
FIG. 1 is a schematic diagram of a portion of a conventional integrated circuit memory showing YCLK signals for controlling access devices coupled to sense amplifiers.

A portion of an integrated circuit memory 10 is shown in FIG. 1. Integrated circuit memory 10 includes sense amplifiers 14 (four are shown but any number is possible), data lines 16, and access devices 12 for coupling the resolved data states on the sense amplifiers 14 to the data lines 16. A "YCLK" internal clock signal is used to provide column address timing to access a particular sense amplifier as is known in the art. In FIG. 1, four separate YSELECT signals YSELECT1–YSELECT4 are shown so that each sense amplifier can be separately accessed. Each YSELECT signal is the sum of a YCLK signal and column address information.

The YCLK signal, therefore, is an internal clock associated with column address time. When YCLK is high (logic one) a sense amplifier 14 in the memory array 10 is being accessed for either read or write purposes.

The YCLK signal has traditionally been free running in prior art integrated circuit memory designs. That is, every falling edge of the main internal clock signal generated a rising YCLK edge.

The termination of the YCLK signal has had two criteria for many designs, either timer controlled, or terminated on the next rising edge of the internal clock if the timer has not expired.

In recent years, two types of memory specifications have been developed by JEDEC, namely DDR1 and DDR2. DDR1 is the first series of DOUBLE DATA RATE DRAMS specified by JEDEC. Minimum burst length is two, which implies a new random column address can be supplied every cycle, and therefore YCLK cannot be longer than one cycle. (Data is output on both edges of clock so BL2 is supported by one cycle). DDR2 is the next series of DOUBLE DATA RATE DRAMS specified by JEDEC. Minimum burst length is four, which implies a new random column address can only be supplied every other cycle, and therefore YCLK can be longer than one cycle.

A free running YCLK signal as in previous designs is not compatible with the DDR2 specification, which allows two complete cycles per read or write operation (thus one whole clock cycle can be dedicated to the YCLK instead of a half cycle). A YCLK signal that terminated on the next main clock rising is too short for DDR2 parts since again this imposes a half cycle limit. A YCLK signal that terminates past the next clock rising edge does not work for DDR1 parts since it would cause contention in the column address path.

What is desired, therefore, is a YCLK signal for an integrated circuit memory that is compatible with both DDR1 and DDR2 specifications.

SUMMARY OF THE INVENTION

In accordance with a particular embodiment of the present invention, a clock generator is provided that is compatible with both DDR1 and DDR2 applications. The YCLK signal is turned on only when an active read or write occurs on the integrated circuit memory, even though the main chip clock is always running. A circuit block (YCLK ON GENERATOR) within the clock generator detects when a read or write is active and initiates a YCLK signal on the next falling edge of the internal clock. Two separate mechanisms are used for determining when to terminate the YCLK. One mechanism is a timer path and the other is a path determined by DDR1 and DDR2 control signals. The timer path is strictly time based and is the same for DDR1 and DDR2 parts or modes of operation. The other signal path is different for DDR1 and DDR2 operating modes. A DDR1 control signal turns off YCLK at the next rising edge of the internal clock, and a DDR2 control signal turns off YCLK at the next falling edge of the internal clock.

The clock generator circuit according to an embodiment of the present invention also includes a "cycle alternator", which is used to turn on the YCLK only for alternating falling edges of the chip in the DDR2 mode.

If a YCLK signal is enabled on a certain internal clock falling edge, then a YCLK cannot be enabled on the next falling edge, only on alternating falling edges. DDR1 parts can initiate a YCLK signal on every falling edge of the internal clock so the alternator circuit is disabled to allow for this.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 2:
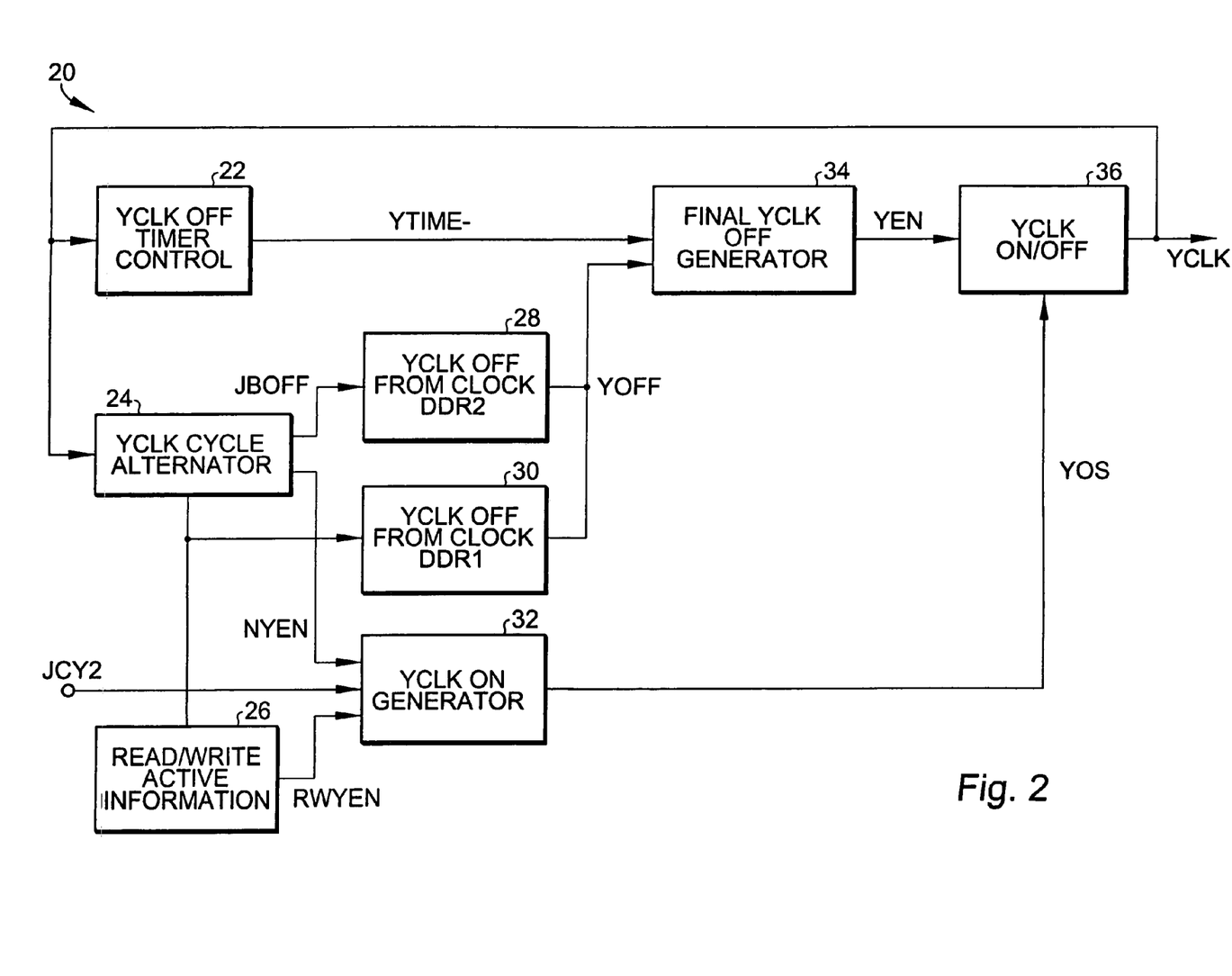
FIG. 2 is a block diagram of a clock generator circuit according to an embodiment of the present invention.

Referring now to FIG. 2, a block diagram of a clock generator circuit 20 according to an embodiment of the present invention is shown. The input signal in FIG. 2 is the JCY2 signal, which is a buffered version of the chip clock. The output signal is the YCLK signal, which is terminated according to three separate operating modes as is described in further detail below.

The YCLK OFF TIMER CONTROL block 22 takes the YCLK signal and generates the YTIME-signal, which is used to control the "time-out" method of terminating the YCLK signal, limiting the YCLK maximum pulse width. The YCLK CYCLE ALTERNATOR block 24 also takes the YCLK signal, as well as the JCY2 chip clock signal and generates the JBOFF and NYEN signals.

The YCLK cycle alternator works like a toggle counter. In the initial state, NYEN ("Next Yclk ENable") is high. If a YCLK is initiated from the YCLK-ON generator at a JCLK falling edge, the circuit toggles such that NYEN=0 and for the next JCLK falling edge, YCLK-ON is disabled.

Figures 3, 3A:
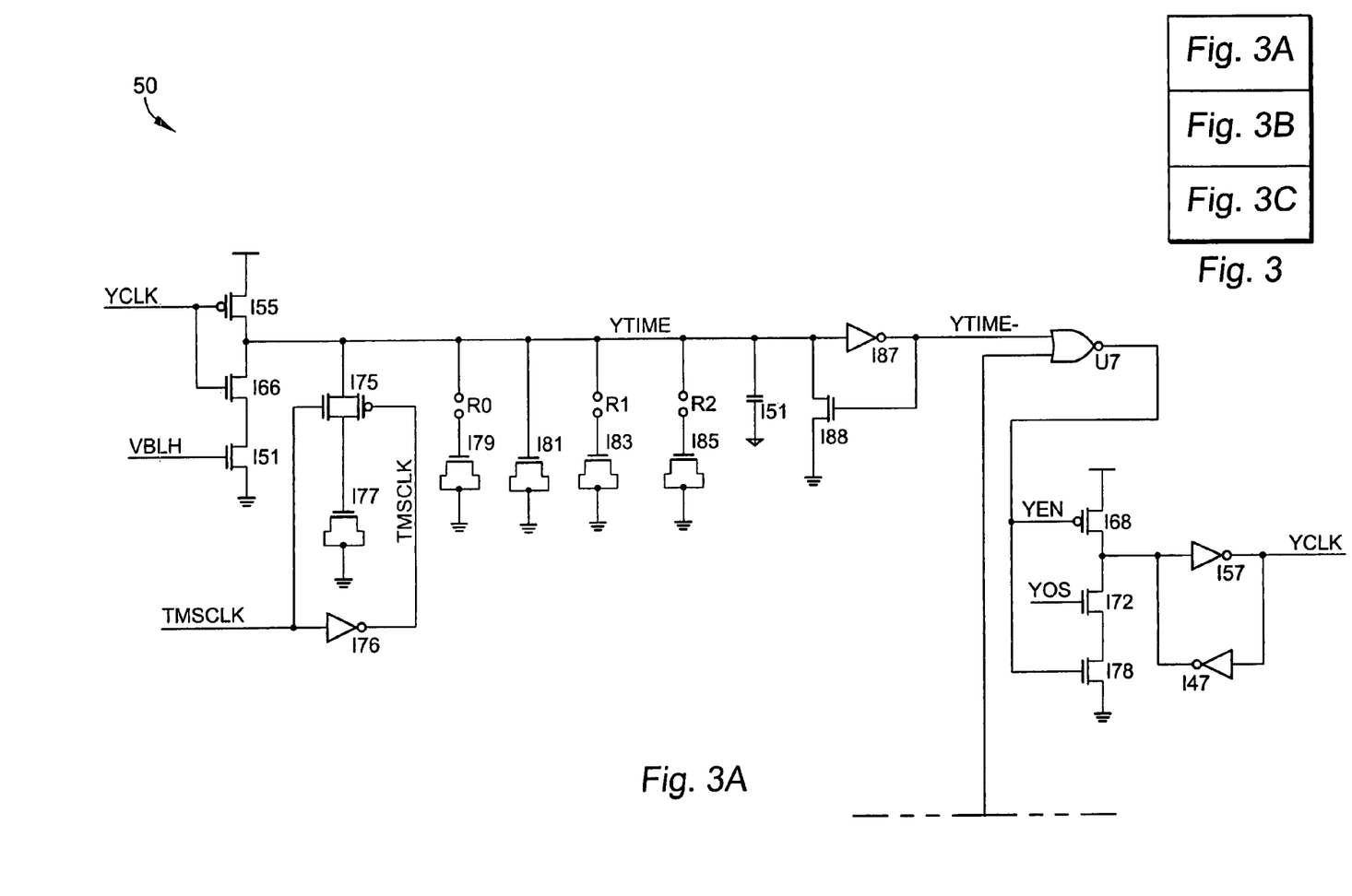
FIG. 3 is a schematic diagram corresponding to the block diagram of FIG. 2 showing additional circuit details and control signals not present in FIG. 2.
Figure 3B:
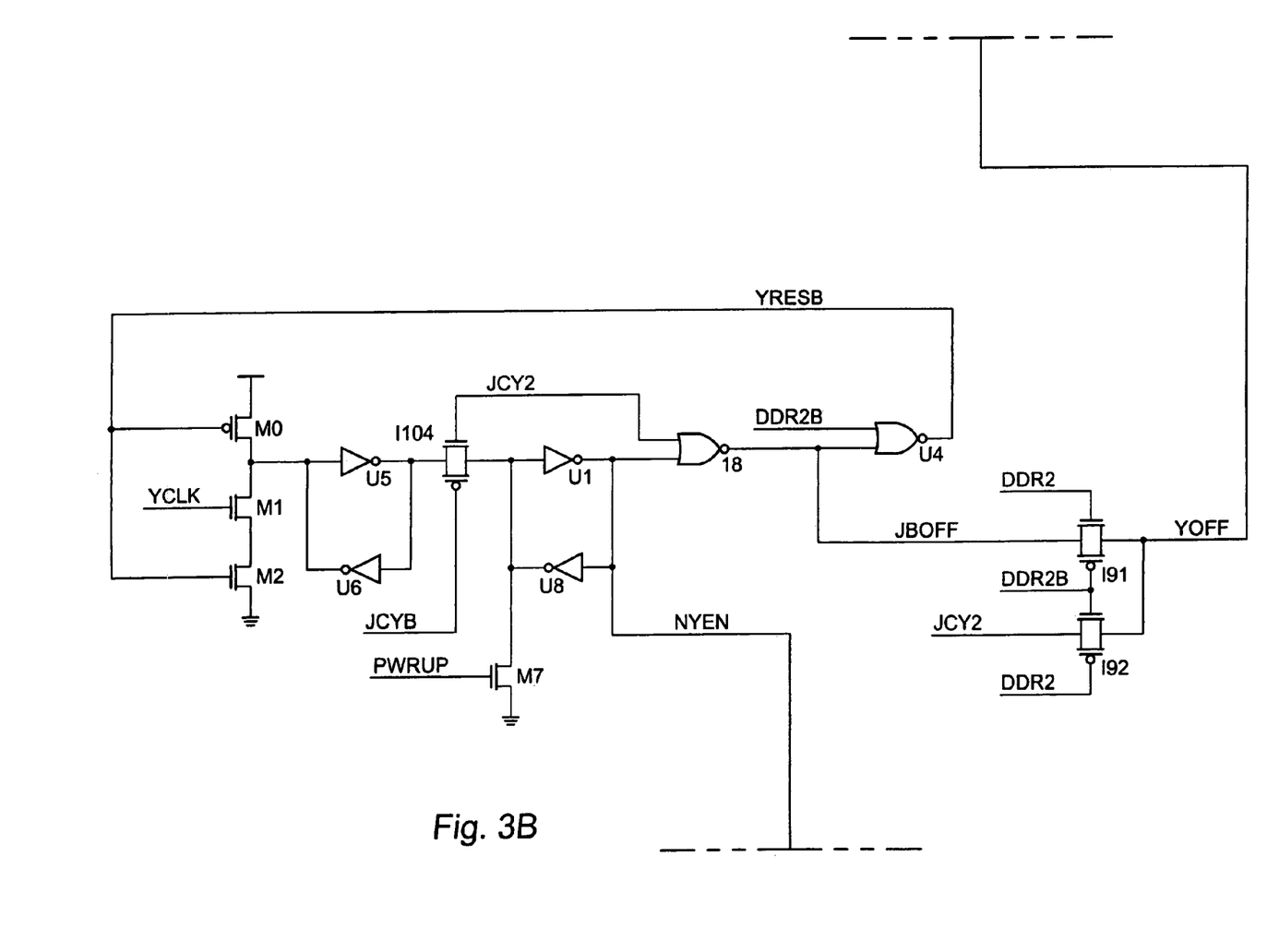
Figure 3C:
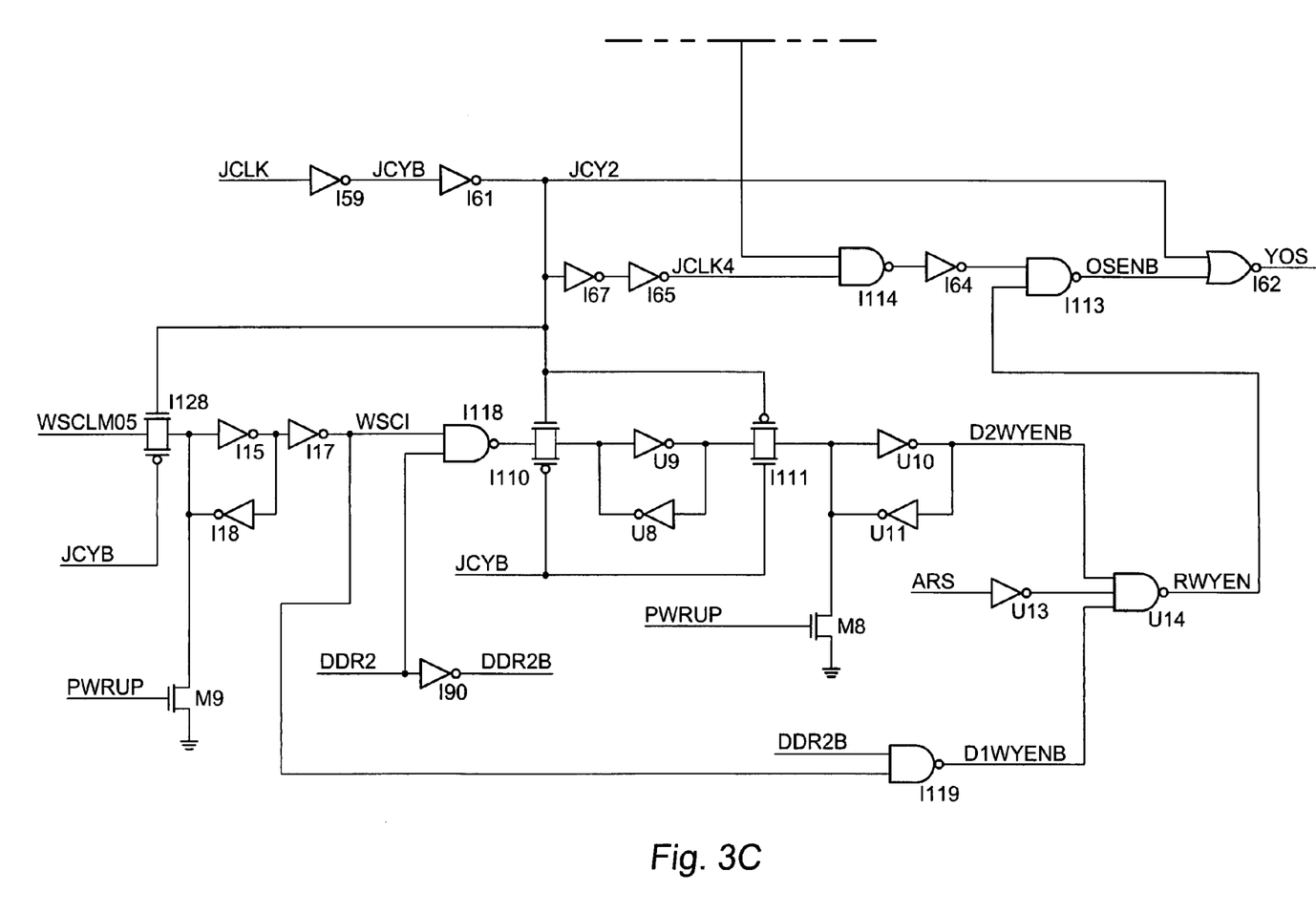

Referring to FIG. 3, the actual counter reset function is done with the M1 and M2 N-channel devices. When YCLK (M1) and YRESB(M2) are both high, the first half of the toggle counter resets. When JCLK=1 at the start of the next chip cycle, this information is passed through the I104 transfer gate and NYEN is set to "0".

If JCLK=0, and NYEN=0, this indicates YCLK was already enabled at the start of that JCLK cycle. In this case the JCLK=0 edge needs to turn off the YCLK (if the timer control has not already done so). JBOFF=1 when JCLK (JCY2)=0 and NYEN=0 to turn off the YCLK in this manner via the FINAL YCLK-OFF generator 34. If JBOFF=1, then YRESB is forced low, this toggles the first half of the counter again through the M0 P-channel device (best seen in FIG. 3), and on the next rising edge of JCLK, the NYEN node toggles back to "1" and YCLK-ON circuit is armed again to generate a new YCLK if required.

The READ/WRITE ACTIVE INFORMATION block 26 generates the RWYEN signal. The RWYEN (Read Write Yclk ENable) goes high when a YCLK is required on the next JCLK falling edge. Either a valid read or write operation requires the YCLK function. Referring to FIG. 3, a valid read in the chip is indicated by the ARS signal going high. A valid write is indicated by the WSCLM05 signal going high.

Continuing to refer to FIG. 3, the read information (ARS) is passed directly through inverter U13 and NAND gate U14 to generate RWYEN. However, the write information is shifted according to JCLK so the eventual YCLK occurs in the proper cycle aligning with valid write data. For the DDR1 mode, this write information has to be shifted one half cycle. For the DDR2 mode, this write information has to be shifted one and one-half cycles. This is all handled in the read/write active information circuit such that if RWYEN=1, then a YCLK is required on the next falling JCLK edge.

NAND gate U14 combines the read, DDR1 write, and DDR2 write information to create a combined RWYEN signal, which is valid if any read or write requires a YCLK.

Referring to FIG. 2, the YCLK OFF FROM CLOCK DDR2 block 28 takes the JBOFF signal and generates the YOFF signal by passing it directly to the YOFF signal via a transfer gate which is enabled (open) for the DDR2 mode and disabled for the DDR1 mode. Thus, in a DDR2 mode YOFF=JBOFF and the YCLK will turnoff each time JBOFF=1.

The YCLK OFF FROM CLOCK DDR1 block 30 takes the JCY2 clock signal and generates the YOFF signal by passing it directly to the YOFF signal via a transfer gate that is enabled (open) for the DDR1 mode and closed for the DDR2 mode. Thus is the DDR1 mode YOFF=JCY2 and the YCLK will turn off every time that the internal clock (JCY2)=1.

The YCLK ON GENERATOR 32 takes the NYEN, JCY2, and RWYEN signals and generates the YOS signal. Since the YCLK can be terminated by timer or clock control, the easiest way to start the YCLK is with a "one-shot pulse". The YOS signal is the one-shot pulse ("Yclk-on One-Shot").

Referring to FIG. 3, previous to JCLK falling, when it is at a "1" state, then JCY2=1, JCLK4=1, and if NYEN=1 and RWYEN=1, then the OSENB=0. In this state the one-shot generator is armed. As soon as JCLK falls, JCY2=0 and YOS=1.

Eventually JCLK4=0 and the OSENB signal has to return to the "1" state, thereby terminating the YOS pulse. The NYEN and RWYEN signal only change state while JCLK=1, so the JCLK falling edge always determines the YOS function. Width and Length ratios are usually skewed in the I67 and I65 inverters to delay JCLK4=0 and to determine the width of the YOS pulse.

Referring to FIG. 2, the FINAL YCLK OFF GENERATOR block 34 takes the YTIME- and YOFF signals and generates the YEN signal by combining them in a NOR function. If either the YTIME- or YOFF signals is equal to "1", then YEN=0 and the YCLK signal returns to the off state ("0").

The YCLK ON/OFF block takes the YEN and YOS signals and generates the YCLK clock signal. If YEN=1, and YOS=1, then the latch in YCLK ON/OFF generator is set and YCLK=1. Since YOS will disappear shortly, a latch is needed to maintain the YCLK=1 state. When YEN=0, either from the timer or JCLK control, then YCLK=0.

Referring now to FIG. 3, a digital circuitry embodiment 50 of the clock generator of the present invention is shown. The following additional signals are shown in FIG. 3: VBLH at the gate of transistor I51, which is an internal DC voltage supply, used to provide a reference for the timer delay; TMSCLK at the input of inverter I76, which is a test mode signal, if TMSCLK=1, then more capacitance is added, increasing the minimum YCLK width; PWRUP at the input of transistors M7 and M9, which is used to initialize the circuit upon chip power-up; WSCLM05 at the input of transmission gate I128, which is the chip's valid write state indicator; JCLK at the input of inverter I59, which is the master or chip clock; DDR2 at the input of inverter I90, which is the DDR2 mode control signal; and ARS at the input of inverter U13, which is the chip's valid read state indicator.

Note that in FIG. 3, the timer delay is set by connecting various MOS devices (I79, I83, I85) to the YTIME node to adjust the net capacitance.

The clock rate of the external clock applied to the part is referred to as "CYCLE", "1Tck", or just "tck". The main internal clock has the same rate or tck value. The main internal clock is called "JCLK". When referring to clock signals, "Tcl" is the "clock low time", or the time a clock signal is low. "Tch" is the "clock high time", or the time a clock is high. The sum of Tcl+Tch is equal to Tck, or the rate for that clock.

In operation, a YCLK signal is only initiated on a chip clock falling edge if the memory array needs to be accessed (read or write operation). This allows DDR2 timing for the YCLK signal to be an entire cycle wide. A free running YCLK cannot be used if the YCLK width is equal to Tcl+Tch, because there is no information on where to start the YCLK in this case. The timing and operation of the clock generator according to an embodiment of the present invention is discussed in further detail below.

Figure 5:
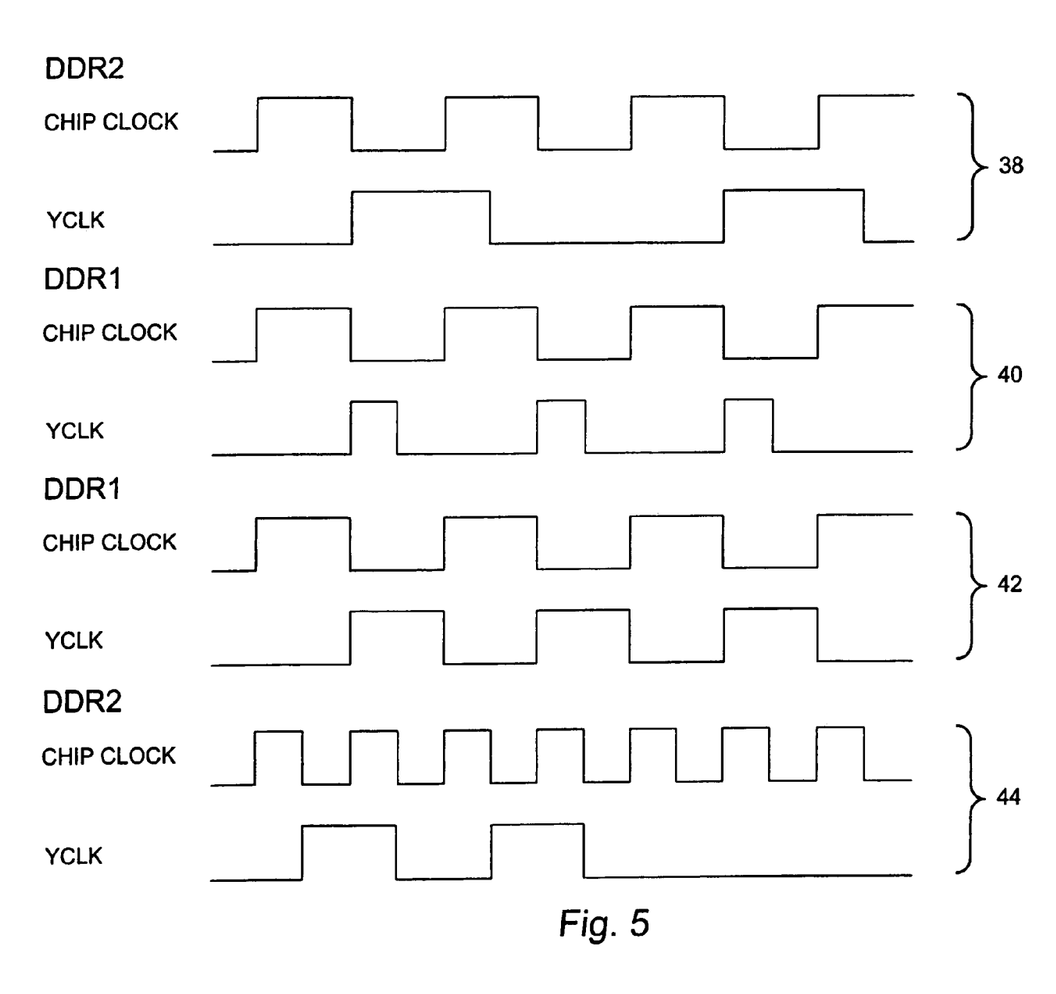
FIG. 5 is a series of timing diagram illustrating various modes of operation for the clock generator circuit according to an embodiment of the present invention.

Regardless of DDR1 or DDR2, if the YCLK has been active long enough such that the timer expires, the timer disables YCLK. Mode 1—$\Delta tYCLK \leq \Delta timer$, which is true for DDR1 and DDR2. See FIG. 5, signal groups 38 and 40.

For DDR1, if $\Delta timer$ is >tcl, then the next rising edge of the chip clock disables YCLK. Mode 2—$\Delta tYCLK \leq tcl$. See FIG. 5, signal group 42.

For DDR1, if a read or write is active, then a YCLK is initiated on every falling edge of the chip clock. See FIG. 5, signal groups 40 and 42.

For DDR2, if $\Delta timer$ is >tcl+tch=tck cycle time, then mode 3—the next falling edge of the chip clock disables the YCLK. See FIG. 5, signal group 44.

Figure 4:
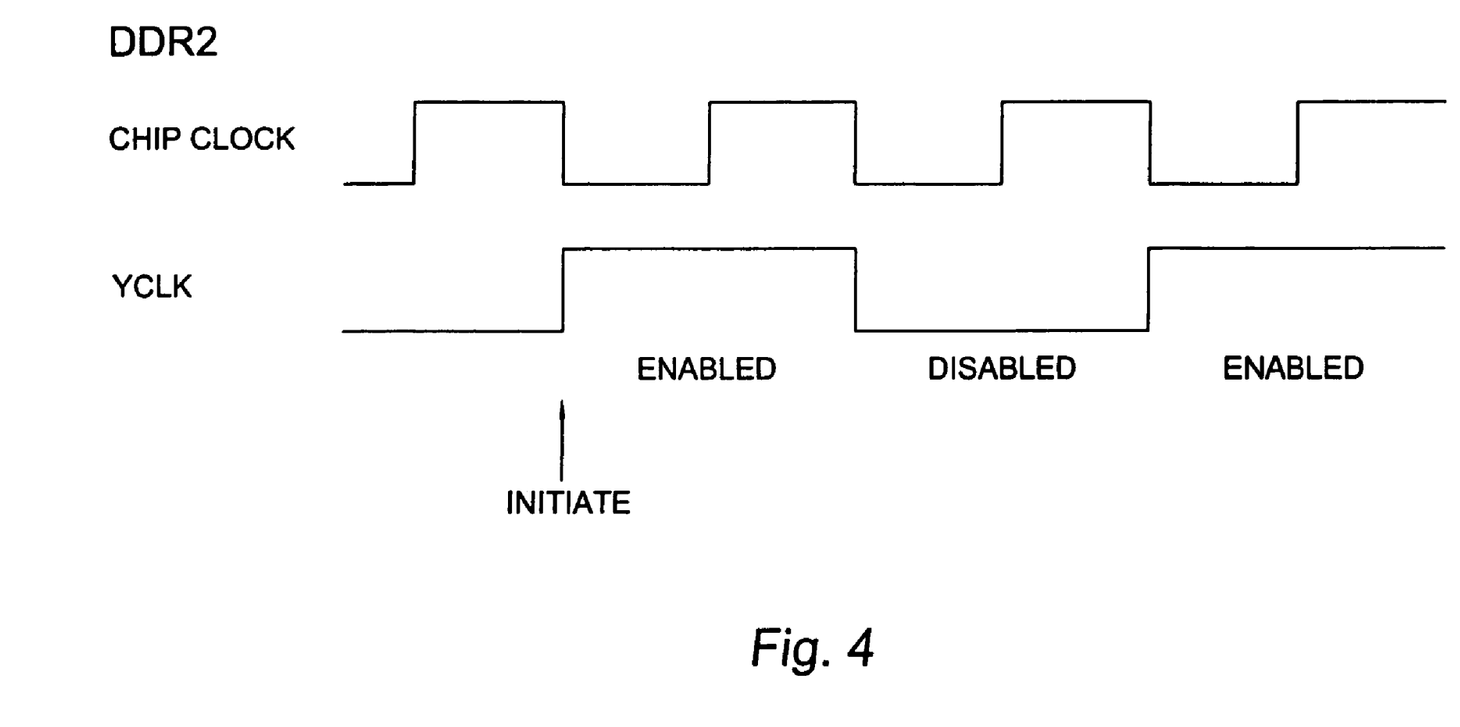
FIG. 4 is a timing diagram associated with the clock generator circuit according to an embodiment of the present invention.

For DDR2, since the falling edge of chip clock can enable (initiate) or disable the YCLK, it is critical that once a YCLK is initiated by a chip clock falling, thereafter it can only initiate another YCLK on every other cycle. See FIG. 4.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

I claim:

1. A YCLK generator for generating an internal clock signal for accessing sense amplifiers in an integrated circuit memory comprising circuitry for selectively enabling the internal clock signal, in which the circuitry for selectively enabling the internal clock signal comprises a YCLK cycle alternator circuit.

2. The YCLK generator of claim 1 further comprising an input for receiving a chip clock signal.

3. The YCLK generator of claim 1 in which the circuitry for selectively enabling the internal clock signal comprises a circuit responsive to read/write active information.

4. The YCLK generator of claim 1 in which the circuitry for selectively enabling the internal clock signal comprises a timer control circuit.

5. The YCLK generator of claim 1 further comprising an input for receiving a power up signal.

6. The YCLK generator of claim 1 further comprising an input for receiving a DDR1 control signal.

7. The YCLK generator of claim 6 wherein the DDR1 control signal is used to disable the YCLK cycle alternator function.

8. The YCLK generator of claim 1 further comprising an input for receiving a DDR2 control signal.

9. The YCLK generator of claim 8 wherein the DDR2 control signal is used to selectively enable the YCLK cycle alternator function.

* * * * *